United States Patent [19]
Koitabashi et al.

[11] Patent Number: 5,500,736
[45] Date of Patent: Mar. 19, 1996

[54] METHOD OF DETECTING POSITIONS

[75] Inventors: Hideki Koitabashi, Tokyo; Masamitsu Yanagihara; Junji Hazama, both of Yokohama, all of Japan

[73] Assignee: Nikon Corporation, Tokyo, Japan

[21] Appl. No.: 339,284

[22] Filed: Nov. 7, 1994

Related U.S. Application Data

[63] Continuation of Ser. No. 95,018, Jul. 23, 1993, abandoned.

[30] Foreign Application Priority Data

Jul. 29, 1992 [JP] Japan ............................ 4-222158

[51] Int. Cl.[6] .................................................. G01B 11/00
[52] U.S. Cl. ........................... 356/375; 356/401; 250/548
[58] Field of Search .................................. 356/372, 375, 356/394, 399–401; 250/548, 561; 382/8, 48, 61

[56] References Cited

U.S. PATENT DOCUMENTS

| | | | |
|---|---|---|---|
| 4,701,859 | 10/1987 | Matsuyama et al. | 356/394 |
| 4,780,617 | 10/1988 | Umatate et al. | 356/401 |
| 4,823,012 | 4/1989 | Kosugi | 356/400 |
| 4,860,374 | 8/1989 | Murakami et al. | 356/375 |
| 5,166,754 | 11/1992 | Suzuki et al. | 356/400 |
| 5,189,494 | 2/1993 | Muraki | 356/375 |
| 5,309,197 | 5/1994 | Mori et al. | 356/400 |

*Primary Examiner*—Hoa Q. Pham
*Attorney, Agent, or Firm*—Shapiro and Shapiro

[57] ABSTRACT

A position detecting method detects each position of a photosensitive substrate when executing shots of circuit patterns so that the circuit patterns are further superposed on the photosensitive substrate already formed with the circuit patterns. The method comprises the steps of performing a shot of a circuit pattern of a reticle in superposition on liquid crystal pixel segments already formed on a glass plate, registering, in a memory, a circuit pattern as a reference image in the liquid crystal pixel segment and performing pattern matching with other fields of the liquid crystal pixel segments by use of this reference image. An alignment is conducted based on a position of circuit pattern extracted thereby.

2 Claims, 4 Drawing Sheets

METHOD OF DETECTING POSITIONS

This is a continuation of application Ser. No. 08/095,018 filed Jul. 23, 1993, now abandoned.

BACKGROUND OF THE INVENTION

1. Field of the Invention

The present invention relates to a method of detecting positions which is suitable for positioning of a photosensitive substrate through an exposure apparatus employed when manufacturing, e.g., a large-sized liquid crystal display element substrate, etc.

2. Related Background Art

A projection exposure apparatus has hitherto been employed for manufacturing a liquid crystal display element or a semiconductor element by use of photolithography. The projection exposure apparatus projects a reticle pattern on a substrate coated with a photosensitive substance on a stage through a projection optical system. Generally, the liquid crystal display element is manufactured by forming multi-layered circuit patterns in superposition on the substrate. On that occasion, it is required that the circuit pattern of the second layer be superposed on, e.g., the circuit pattern of the first layer at a high accuracy. This in turn requires a highly accurate alignment of the 1st-layer circuit pattern already formed on the photosensitive substrate with the reticle formed with a transfer circuit pattern for the second layer when effecting a shot of, e.g., the 2nd-layer circuit pattern on the photosensitive substrate.

One of such alignment methods of the photosensitive substrate is an alignment method based on an image processing system involving pattern matching.

FIG. 3 schematically illustrates a construction of the projection exposure apparatus for manufacturing a large-sized liquid crystal display element substrate in which the alignment is effected according to the conventional image processing system. Referring to FIG. 3, beams of exposure light emitted from a light source 1 such as a mercury-arc lamp, etc. are converged through an elliptical mirror 2. The beams thereafter fall on a condenser lens system 3 via an unillustrated optical integrator or the like. A reticle R is illuminated with the beams of exposure light with a substantially uniform illuminance which have properly been converged by the condenser lens system 3. With this exposure light, a pattern of the reticle R is subjected to a projection-shot on each shot field on a glass plate 4 coated with a photosensitive substance and serving as a photosensitive substrate through a projection optical system PL. The multi-layered circuit patterns are formed in superposition on the glass plate 4, thereby manufacturing the large-sized liquid crystal display element substrate.

This glass plate 4 is held on a Z-stage 5. The Z-stage 5 is mounted on an XY-stage 6. The XY-stage 6 performs positioning of the glass plate 4 within a plane (XY plane) perpendicular to the optical axis of the projection optical system PL. The Z-stage 5 effects position of the glass plate 4 in the optical-axis (Z-axis) direction of the projection optical system PL. Note that a θ-table for turning the glass plate 4 is, though not shown, interposed between the Z-stage 5 and the glass plate 4. Further, a fiducial mark aggregate 7 formed with a variety of alignment marks is fixed in the vicinity of the glass plate 4 on the Z-stage 5. Further, X- and Y-directional moving mirrors 8 are fixed thereto. The numeral 9 designates a biaxial laser interferometer. The numeral 10 represents a driving unit. Laser beams from the laser interferometer 9 are reflected by the moving mirror 8. Coordinates of the XY-stage 5 are always measured by the laser interferometer 9. The driving unit 10 drives the XY-stage 6 in accordance with a coordinate value measured by the laser interferometer 9.

The numeral 11 stands for an alignment scope. An alignment mark RM existing in the vicinity of a pattern field of the reticle R is irradiated with alignment light from the alignment scope 11 when aligning the reticle R. The light reflected from this alignment mark RM is further reflected by a mirror 12 and returns to the alignment scope 11. Therefore, the reticle R is aligned by adjusting a position of the reticle R on the basis of an image position of the alignment mark R which is re-formed inwardly of the alignment scope 11. Further, the alignment mark RM of the reticle R and the alignment mark within the fiducial mark aggregate 7 on the Z-stage 5 are simultaneously viewed through the alignment scope 11. The reticle R may be aligned based on a positional relationship between two images thereof. Besides, the positional relationship therebetween can be also obtained by simultaneously viewing the alignment mark of the reticle R and the alignment mark on the glass plate 4 through the alignment scope 11.

The numeral 13 denotes a light sending system of an autofocus detection system. The numeral 14 represents a light receiving system of the autofocus detection system. An image of a detection pattern such as a slit pattern is projected on the glass plate 4 from the light sending system 13 obliquely to an optical axis AX of the projection optical system PL. The image of the detection pattern is re-formed within the light receiving system 14 by the reflected light from the detection pattern image. A height of an exposure surface of the glass plate 4 is obtained from a positional shift quantity of the re-formed image of the detection pattern. The height of the exposure surface of the glass plate 4 is set to a best focus position with respect to the projection optical system PL by means of the Z-stage 5.

Further, an image processing alignment optical system is disposed sideways of the projection optical system PL. In this alignment optical system, the numeral 15 designates an objective lens. The reflected light from a viewing area illuminated with the light coming from an unillustrated illumination system of the glass plate 4 is incident on a conjugate index plate 17 exhibiting a light transmitting property via the objective lens 15 and a mirror 16. Index marks are depicted on the conjugate index plate 17. The exposure surface of the glass plate 4 is conjugate to a depiction surface of the index marks of the conjugate index plate 17. A pattern image of the viewing area of the glass plate 4 is formed on the depiction surface. Further, the beams of light penetrating the conjugate index plate 17 are converged at an imaging plane of the CCD camera 19 which uses a charge coupled imaging device (CDD) through a relay lens 18. Formed on the imaging plane thereof are the image of the viewing area pattern of the glass plate 4 and the index mark image of the conjugate index plate 17. A video signal (imaging signal) outputted from the CCD camera 19 is supplied to a pattern matching unit 20.

FIG. 4A shows one example of the patterns on the glass plate 4 in FIG. 3. As illustrated in FIG. 4A, two liquid crystal pixel segments 21A, 21B are formed on the glass plate 4 by processes conducted so far. A single or a plurality of circuit patterns are formed on the respective liquid crystal pixel segments 21A, 21B. Further, a plurality of cross alignment marks 22-1, 22-2, . . . , 22-9 intrinsic to the apparatus are formed along the peripheries of the liquid crystal pixel segments on the glass plate 4.

Then, when executing a shot of a circuit pattern of the next layer, i.e., the pattern of the reticle R on the glass plate 4, the alignment marks 22-1 to 22-9 on the glass plate 4 are detected by pattern matching based on a normalized correlation method or the like. Specifically, when detecting the alignment mark 22-6 in FIG. 4A, a viewing area embracing the alignment mark 22-6 of the glass plate 4 is set downwardly of the objective lens 15 by driving the XY-stage 6 in FIG. 3. FIG. 4B illustrates a processed image 23-6 to be imaged by the CCD camera 19 on such an occasion. This processed image 23-6 includes an image 22-6G of the alignment mark 22-6.

Further, FIG. 4C shows a reference image 25. This reference image 25 includes a specified mark 24 having the same shape as those of the alignment marks 22-1 to 22-9 in FIG. 4A. The reference image 25 and the specified mark 24 are obtained by imaging video signals as templates stored in an internal memory of the pattern matching unit 20. In this pattern matching unit 20, a video signal corresponding to a sampling image having the same size as that of the reference image 25 in the processed image 23-6 undergoes pattern matching with a video signal (template) of the reference image 25. Detected from the processed image 23-6 is an image 22-6G of the same alignment mark as the specified pattern 24 of the reference image 25. Obtained is a positional shift quantity of the image 22-6G with respect to a design position in which the image 22-6G within the processed image 23-6 should exist in the coordinates of the XY-stage 6 in FIG. 3 in this case. Coordinates of the alignment mark 22-6 within the XY plane are acquired.

Similarly, other alignment marks 22-1 to 22-5 and 22-7 to 22-9 in FIG. 4A are detected by the pattern matching, and coordinates thereof are also obtained. Subsequently, design coordinates of the alignment marks 22-1 to 22-9 on the glass plate 4 are compared with the actually measured coordinates. A positional shift quantity of the glass plate 4 is thereby calculated. A shot of the pattern of the reticle R is performed while positioning the respective shot fields on the glass plate 4. This is effected based on a coordinate system obtained by correcting the positional shift quantity with respect to the coordinate system on the glass plate 4.

According to the conventional projection exposure apparatus, however, the alignment marks 22-1 to 22-9 intrinsic to the apparatus employed for the alignment can not be disposed inwardly of the liquid crystal pixel segments 21A, 21B. These alignment marks can only be arranged along the peripheries of the liquid crystal pixel segments 21A, 21B. Hence, positional shifts of the circuit patterns themselves within the liquid crystal pixel segments 21A, 21B can not be directly measured. This results in an offset in the coordinate system on the glass plate. This in turn leads to such an inconvenience that a superposing accuracy (matching accuracy) between, e.g., the 1st- and 2nd-layer circuit patterns decreases. In particular, the offset in the coordinate system increases with larger image fields of the liquid crystal pixel segments 21A, 21B. The drop in the superposing accuracy thereof is not ignorable.

Additionally, a conceivable measure for correcting the offset in the coordinate system is to increase the number of the alignment marks disposed along the peripheries of the liquid crystal pixel segments 21A, 21B on the glass plate 4. If the image fields of the liquid crystal pixel segments 21A, 21B are increasingly enlarged, however, it is difficult to precisely estimate internal offsets of the liquid crystal pixel segments 21A, 21B. Further, the alignment marks shown in FIG. 4A are not all disposed along the periphery of the glass plate 4. Consequently, there is a possibility of easily receiving an influence of the manufacturing process. The alignment marks also undergo a relatively large damage when forming the multi-layered circuit patterns. The alignment marks are therefore hard to precisely detect, and there is a possibility in which an accuracy of measuring the offset in the coordinate system worsens.

SUMMARY OF THE INVENTION

It is a primary object of the present invention which has been devised in view of such points given above to further enhance a superposing accuracy between circuit patterns of different layers. This is attained by precisely detecting respective positions of a photosensitive substrate even if fields of already-formed circuit patterns are large when detecting the positions of the photosensitive substrate in accordance with a pattern matching system in effecting shots of the circuit patterns while further superposing the circuit patterns on the photosensitive substrate already formed with circuit patterns.

According to one aspect of the present invention, there is provided a first position detecting method based on a pattern matching system. The first position detecting method comprises the steps of storing a first video signal of a predetermined mark serving as a fiducial mark in the form of a template and detecting a second video signal by imaging a further mark within a predetermined field on a substrate formed with pattern fields (21A, 21B) in which, as illustrated in, e.g., FIG. 1, a predetermined pattern is repeatedly disposed. The first method further comprises the step of detecting the positions of the substrate (4) by comparing a position of the further mark in the second video signal relative to the predetermined mark in a video signal corresponding to the template. In this position detecting method, the predetermined fiducial mark is an arbitrary pattern (26-1) within the pattern fields (21A, 21B) on the substrate (4). A video signal of the arbitrary pattern within the pattern fields (21A, 21B) is detected as the second video signal.

According to another aspect of the present invention, there is provided a second position detecting method based on a pattern matching system, comprising the steps of storing images of marks formed on a photosensitive substrate (4) prior to transferring second pattern fields on the photosensitive substrate (4) formed with first pattern fields (21A, 21B) in which, as illustrated in, e.g., FIGS. 1 and 2A to 2C, a pattern is repeatedly disposed. The second method also comprises the step of detecting two-dimensional positions of the first pattern fields (21A, 21B) by detecting the position of a predetermined mark from the fields on the photosensitive substrate (4). This method further comprises a first step of imaging a pattern (26-1) selected from the first pattern fields (21A, 21B) as the predetermined mark and storing this imaged pattern as a reference image pattern (28).

The method according to the present invention further comprises a second step of storing, as a processed image (32), a field including other patterns different from the stored pattern (26-1) within the first pattern fields (21A, 21B), a third step of detecting the same pattern (34) as the reference image pattern (28) from the processed image (32) and a fourth step of obtaining a position of the same pattern (34), detected in the third step with respect to the field of the processed image (32).

According to the above-described first position detecting method of this invention, the arbitrary pattern (26-1) within the pattern fields (21A, 21B) on the substrate (4) is selected as a predetermined fiducial mark. The video signal of the arbitrary pattern (26-1) is stored as a template. Next, the video signal of the same pattern within the pattern fields (21A, 21B) on the substrate (4) is detected as the second video signal. Matching of the second video signal with a video signal corresponding to the template is performed. On this occasion, if the same patterns (26-2 to 26-8) as the arbitrary pattern (26-1) exist in the pattern fields (21A, 21B) on the substrate (4), a video signal of a field including the same patterns (26-2 to 26-8) is detected from the template.

Next, the positions of the video signals of the same patterns (26-2 through 26-8) are detected. These detected positions are compared with the design position, thereby detecting an offset quantity of the substrate (4). In this case, it is possible to detect the offset in the coordinate system of the internal positions of the pattern fields (21A, 21B). The offset in the internal coordinate system of the pattern fields (21A, 21B) can be therefore detected more accurately than in the prior art. Accordingly, the substrate (4) is aligned to correct the offset, thereby enhancing the alignment accuracy.

In addition, according to the second position detecting method of this invention, the pattern (26-1) selected from the first pattern fields (21A, 21B) on the photosensitive substrate (4) is imaged prior to transferring the second pattern fields on the photosensitive substrate (4). The imaged pattern is stored as the reference image pattern (28). Next, the processed image (32) is imaged within the first pattern fields (21A, 21B) on the photosensitive substrate (4). The same pattern (34) as the reference image pattern (28) is detected within this processed image (32). Obtained is a position of this pattern (34) with respect to the field of the processed image (32).

For instance, a relative moving quantity of the imaging means to the photosensitive substrate (4) is measured. The position of the processed image within the photosensitive substrate (4) is thereby measured. The position of the pattern (34) within the processed image (32) is added to that position of the processed image (32), thereby calculating a position of the pattern (34) within the photosensitive substrate (4). Hence, this calculated position is compared with the design position. The offset in the coordinate system in the position of the pattern (34) on the photosensitive substrate (4) is thereby detected. In this case, it is possible to detect the offset in the coordinate system in the internal positions of the first pattern fields (21A, 21B). The offset in the internal coordinate system of the first pattern fields (21A, 21B) can be therefore detected more accurately than in the prior art. Hence, the photosensitive substrate (4) is aligned to correct the offset therein, with the result that the alignment accuracy is enhanced. The superposing accuracy between the first pattern fields (21A, 21B) and the second pattern fields to be transferred next is enhanced.

That is, the arbitrary pattern within the pattern field on the substrate can be set as a reference pattern. Therefore, even if the pattern fields are considerably large, there is in principle an advantage of accurately detecting the positions of the respective fields on the substrate.

Further, according to the second position detecting method, the pattern selected from the first pattern field is imaged and registered as a reference image pattern. The same pattern as the reference image is detected from the images taken in the fields other than the first pattern field. It is therefore possible to accurately detect the position of each field of the photosensitive substrate even when the first pattern field is considerably large. Accordingly, the alignment of the photosensitive substrate prior to the transfer of the second pattern field can be conducted accurately. The superposing accuracy between the first and second pattern fields can be enhanced.

BRIEF DESCRIPTION OF THE DRAWINGS

Other objects and advantages of the present invention will become apparent during the following discussion in conjunction with the accompanying drawings, in which.

DESCRIPTION OF THE PREFERRED EMBODIMENTS

Figure 1:
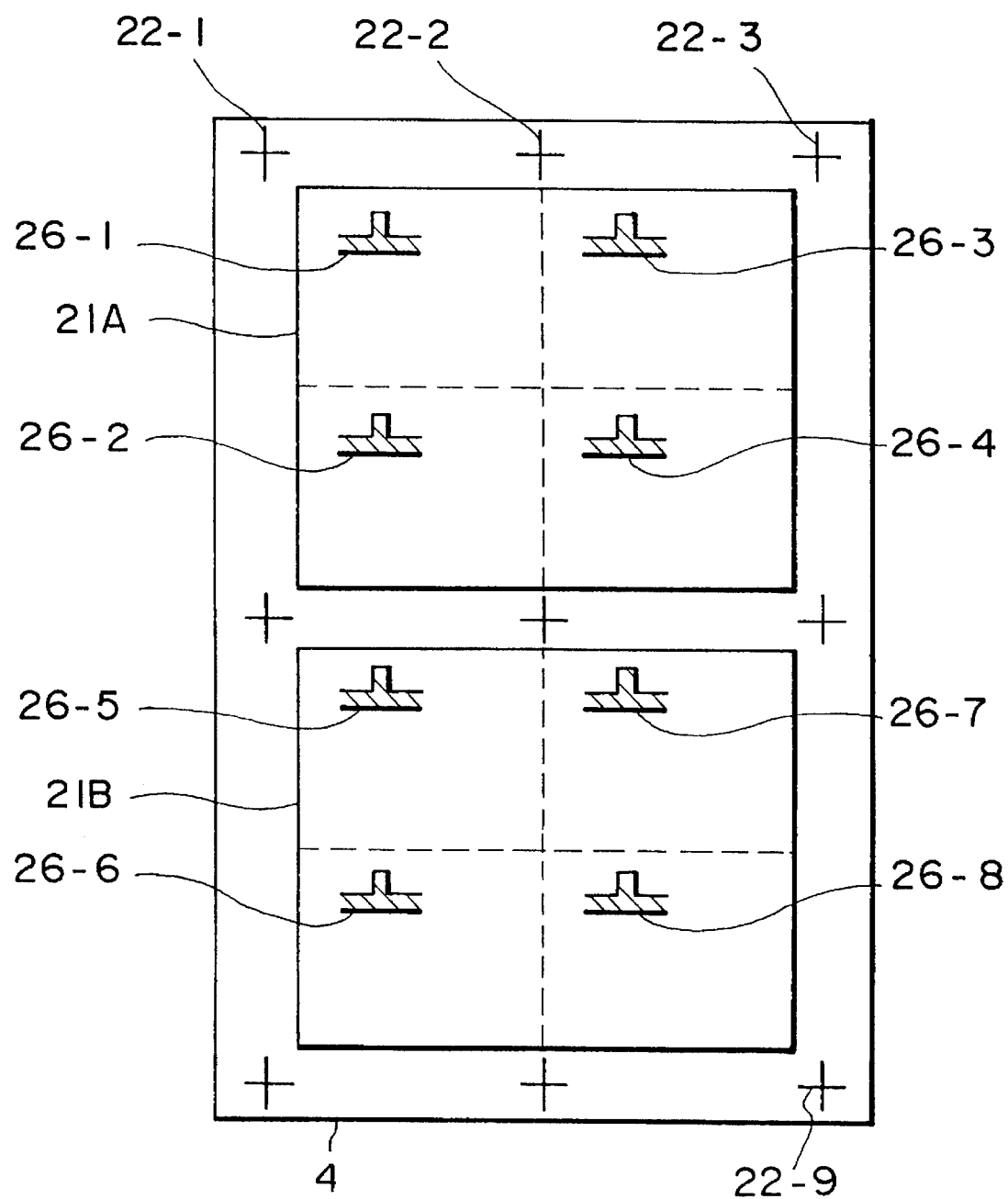
FIG. 1 is a plan view illustrating patterns on a glass plate to which an alignment method in one embodiment of this invention is applied.

One embodiment of a method of detecting positions according to the present invention will hereinafter be described with reference to FIGS. 1, 2A to 2C and 3. In accordance with this embodiment, the present invention is applied to an alignment method of a glass plate 4. This alignment method is used when manufacturing a large-sized liquid crystal display element substrate by shots of circuit patterns superposed on the glass plate 4 though a projection exposure apparatus of FIG. 3. Turning to FIG. 1, the portions corresponding to those in FIGS. 3 and 4A to 4C are marked with the like numerals, and detailed explanations thereof will be omitted.

FIG. 1 illustrates the glass plate 4 serving as a photosensitive substrate and coated with a photosensitive substance. Referring again to FIG. 1, a single- or multi-layered circuit patterns are formed on liquid crystal pixel segments 21A, 21B on the glass plate 4 by the processes conducted so far. Further, alignment marks 22-1, 22-2, . . . , 22-9 are formed along the peripheries of the liquid crystal pixel segments 21A, 21B.

In addition, as illustrated in FIG. 1, the liquid crystal pixel segments 21A, 21B on the glass plate 4 are each formed with a plurality of repetitions of a certain pattern. For instance, circuit patterns 26-1 through 26-4 existing in different positions are the same within the liquid crystal pixel segment 21A. Circuit patterns 26-5 through 26-8 existing in different positions are the same within the liquid crystal pixel segment 21B. Besides, the circuit patterns 26-5 through 26-8 are the same as the circuit pattern 26-1. In this embodiment, as will be shown below, the glass plate 4 is aligned in the following manner with those circuit patterns 26-1 through 26-8 serving as marks. This requires a registration of one of the circuit patterns 26-1 to 26-8 as a reference image.

Figure 3:
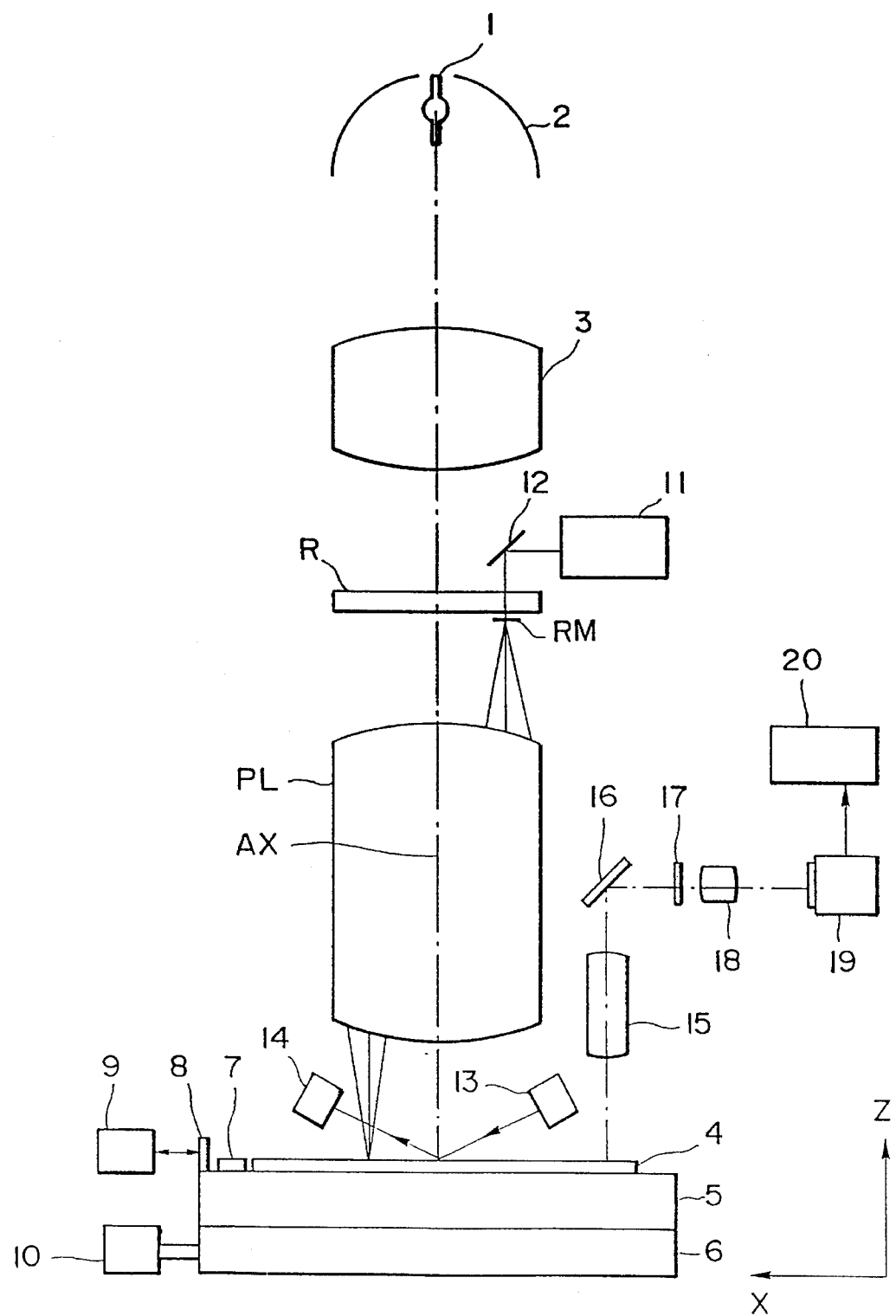
FIG. 3 is a block diagram schematically illustrating a projection exposure apparatus which uses the alignment method in the embodiment of this invention which uses a conventional alignment method and the alignment method as well in the embodiment of this invention.
Figure 4A:
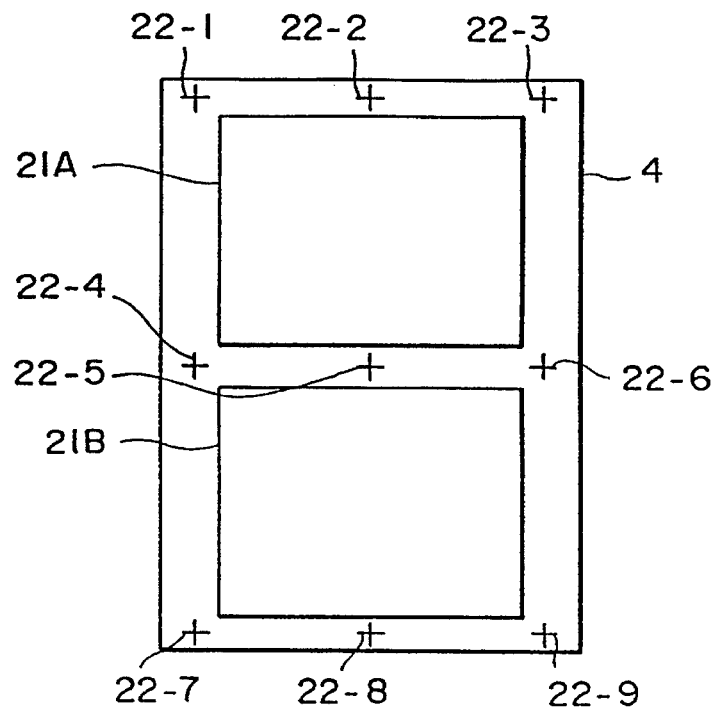
FIG. 4A is a plan view showing patterns on the glass plate to which a conventional alignment method is applied.
Figure 4B:
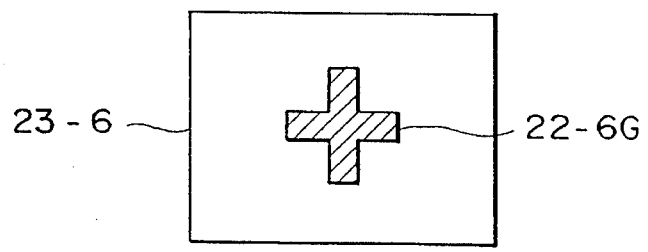
FIG. 4B is a diagram showing a processed image including images of alignment marks of FIG. 4A.
Figure 4C:
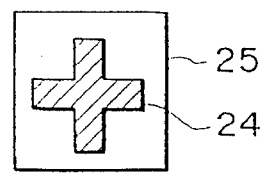
FIG. 4C is a diagram illustrating a reference image 25 for a conventional alignment mark image.

Obtained at first before this registration is an offset quantity (baseline) between an origin of a coordinate system on the reticle R in FIG. 3 and an origin of a coordinate system on the glass plate 4 in FIG. 1. For this purpose, for example, the alignment mark 22-1 on the glass plate 4 shown in FIG. 4A is selected.

An alignment mark RM of the reticle R and the alignment mark 22-1 on the glass plate 4 are simultaneously viewed by means of an alignment scope 11 in FIG. 3. Then, an XY-stage 6 is driven to cause a micromotion of the glass plate 4. Coordinates of the XY-stage 6 at that time are detected so that an image of the alignment mark RM is superposed on an image of the alignment mark 22-1 within a viewing image plane through the alignment scope 11. The offset quantity is obtained based on the coordinates thereof.

Further, rotational angles of the reticle R and of the glass plate 4 are corrected by superposing an image of another alignment mark on the reticle R on an image of, e.g., the alignment mark 22-3 on the glass plate 4 in a direction X or Y by use of another alignment scope. Note that the offset quantity thereof can be calculated, or the rotational angles can be also corrected even by employing alignment marks of a fiducial mark aggregate 7 on a Z-stage 5.

Next, referring again to FIG. 1, the reference image is registered on the basis of the alignment mark 22-1 whose relative positional relationship with the reticle R is obtained. For example, the circuit pattern 26-1 close to the alignment mark 22-1 is selected as a reference image. However, the circuit pattern 26-4 apart from the alignment mark 22-1 may be selected as a reference image. If the circuit pattern 26-1 in close proximity to the alignment mark 22-1 is set as a reference image, however, a multi-offset quantity produced by undergoing a variety of processes decreases enough to be ignorable in many cases. A position in terms of design with the alignment mark 22-1 being fiducial can be employed as a position of the circuit pattern 26-1. This eliminates a necessity for effecting the correction arithmetic. On the other hand, if, e.g., the circuit pattern 26-4 is selected as a reference image, and when the circuit pattern 26-4 is a reference pattern, X-directional differences between design positions and actually measured positions of other circuit patterns 26-1, 26-2, 26-3 are set to, e.g., 1, 2 and −1. In this case, the correction may be performed to zeroize the X-directional difference between the design position and the actually measured position of the circuit pattern 26-1. More specifically, 0, 1, −2 and −1 are X-directional differences between the design positions and the actually measured positions of the circuit patterns 26-1, 26-2, 26-3, 26-4.

For obtaining the position of the circuit pattern 26-1 (or 26-4, etc.) as a reference image more accurately, there may be obtained a difference between the design position and the actually measured position of the circuit pattern 26-1 (or 26-4, etc.) by, for instance, a proof print (exposure).

Specifically, when the circuit pattern 26-1 of the glass plate in FIG. 1 is selected as a reference image, the circuit pattern 26-1 is shifted downwardly of an objective lens 15 in FIG. 3. An image in the vicinity of the circuit pattern 26-1 and an image of an index mark of a conjugate index plate 17 are taken by means of a CCD camera 19. A processed image 27 shown in FIG. 2A is thereby obtained.

Figure 2A:
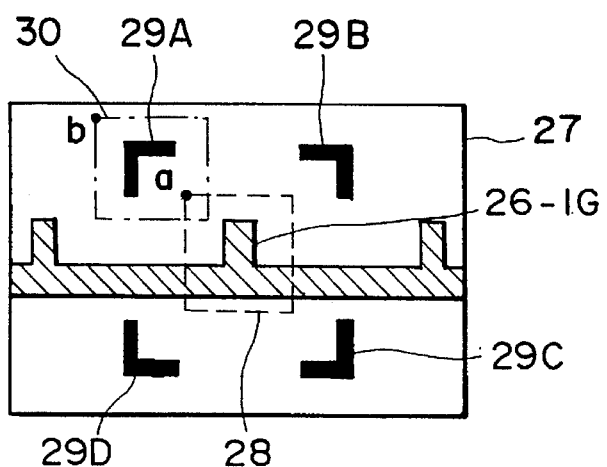
FIG. 2A is a diagram showing a processed image 27 including a reference image 28 which is registered in the embodiment.

Turning to FIG. 2A, an image 26-1G of the circuit pattern 26-1 is formed at the center of the processed image 27. A rectangular field having a predetermined area which surrounds the image 26-1G is therefore defined as a reference image 28. Then, a video signal of this reference image 28 is stored (registered) as a template in a memory of a pattern matching circuit 20 of FIG. 3. Further, two-dimensional coordinates of an origin a of the reference image 28 within the processed image 27 are (Xmo, Ymo). The two-dimensional coordinates are obtained by multiplying a coordinate value on the imaging plane of the CCD camera 19 by a magnification β with respect to an exposure surface of the glass plate 4 from the imaging plane. Hence, a two-dimensional coordinate difference is equal to a distance on the glass plate 4 (the following is the same).

Figure 2B:
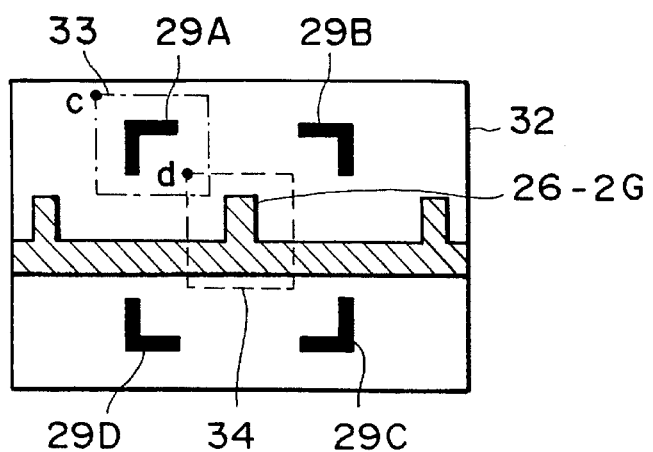
FIG. 2B is a diagram showing a processed image 32 undergoing pattern matching.
Figure 2C:
FIG. 2C is a diagram illustrating a reference image 31 of an index mark image.

Next, in FIG. 2A, index mark images 29A to 29D of the conjugate index plate 17 in FIG. 3 are formed along the periphery of the image 26-1G. In accordance with this embodiment, as illustrated in FIG. 2C, a reference image 31 of the index mark is a rectangular field having a predetermined area which encompasses a pattern 29 having the same shape as the image 29A among the index mark images 29A to 29D. A video signal of the reference image 31 of this index mark is also stored (registered) in the memory of the pattern matching circuit 20 in FIG. 3. The pattern matching circuit 20 effects pattern matching of a video signal of the processed image 27 with the video signal of the index mark reference image 31 shown in FIG. 2C. The rectangular field 30 surrounding the index mark image 29A in FIG. 2A is extracted as a field matching with the reference image 31. Two-dimensional coordinates of an origin b of the field 30 within the processed image 27 are therefore (Xi, Yi).

Based on the coordinates (Xmo, Ymo) and (Xi, Yi), when the field 30 encompassing the index mark image 29A is a reference field, normal coordinates (Xbp, Ybp) of the reference image 28 are given by the following formulae:

$$Xbp=Xi-Xmo \quad (1A)$$

$$Ybp=Yi-Ymo \quad (1B)$$

Next, e.g., the circuit pattern 26-2 in FIG. 1 is shifted downwardly of the objective lens 15 by driving the XY-stage 6 in FIG. 3. An image in the vicinity of the circuit pattern 26-2 is taken by the CCD camera 19. However, a moving quantity of the glass plate 4 with driving of the XY-stage 6 is set equal to a distance in terms of design between the circuit pattern 26-1 and the circuit pattern 26-2. A processed image 32 shown in FIG. 2B is obtained on the imaging plane of the CCD camera 19. Referring to FIG. 2B, an image 26-2G of the circuit pattern 26-2 is formed at the center of the processed image 32. Index mark images 29A to 29D are formed along the periphery of the image 26-2G. Herein, the pattern matching of the processed image 32 in FIG. 2B is effected by use of the index mark reference image 31 in FIG. 2C. A rectangular field 33 surrounding the index mark image 29A is thereby singled out. Obtained are two-dimensional coordinates (Xi', Yi') of an origin c of this field 33 with respect to the processed image 32.

Thereafter, the pattern matching circuit 20 in FIG. 3 performs the pattern matching of the processed image 32 in FIG. 2B by use of the reference image 28 registered in FIG. 2A. A field 34 encompassing the image 26-2G of the circuit pattern 26-2 is conceived the same as the reference image 28 and is therefore extracted. Two-dimensional coordinates of an origin d of the field 34 within the processed image 32 are (Xm, Ym). In this case, if it is assumed that the patterns formed on the glass plate 4 have no multi-offset quantity, a coordinate value of the origin d which is based on the origin c is presumably equal to a coordinate value of the origin a in FIG. 2A which is based on the origin b.

As a matter of fact, however, the multi-offset quantity exists in the patterns formed on the glass plate 4. The alignment mark 26-2 in FIG. 1 therefore deviates by (Xr, Yr)

from the original design position with respect to the alignment mark 26-1. A positional shift quantity (Xr, Yr) is given by the following formulae in combination with the normal coordinates (Xbp, Ybp) expressed by the above-mentioned formulae (1A) and (1B).

$$Xr=Xbp-(Xi'-Xm) \qquad (2A)$$

$$Yr=Ybp-(Yi'-Ym) \qquad (2B)$$

Therefore, for example, a shot of the pattern of the reticle R is effected on the field including the circuit pattern 26-1 of the glass plate 4 in FIG. 1. When a shot of the pattern of the reticle R is thereafter performed on the field including the circuit pattern 26-2, it is required that positioning coordinates of the glass plate 4 be corrected by the positional shift quantity (Xr, Yr) expressed by the formulae (2A) and (2B) with respect to the set value. An alignment accuracy is thereby enhanced. A superposition accuracy between different layers is also enhanced.

Referring to FIG. 1, the positions of other circuit patterns 26-3 through 26-8 are similarly detected by the pattern matching. Obtained are positional shift quantities of the detected positions from the original position when the circuit pattern 26-1 is a reference pattern. Then, the positioning of the glass plate 4 is performed while correcting this positional shift quantity, thereby enhancing the alignment accuracy. Besides, the correction of the positioning accuracy of the glass plate involves two methods. One method is to make a correction according to the unit of shot field by selecting a fiducial mark only from each shot field of the glass plate 4. The other method is to make a correction according to the unit of plate by selecting the fiducial mark over the entire surface of the glass plate 4.

Note that the index mark image of the conjugate index plate 17 in FIG. 3 is used as a base of the position within the processed images 27, 32 in this embodiment. There is, however, eliminated an influence of a shift of the image-forming position on the imaging plane of the CCD camera 19 due to fluctuations in the alignment optical system by using the index mark image. Hence, if the shift of the image-forming position is small enough to be ignorable, the conjugate index plate 17 is not necessarily employed.

As discussed above, this invention is not restricted to the foregoing embodiments but may take a variety of configurations without deviating from the spirit and scope of the invention.

What is claimed is:

1. A method of detecting position of a substrate formed with at least one pattern field in which a plurality of pattern elements having a predetermined shape to form a circuit pattern are repeatedly disposed at a predetermined interval, said method comprising the steps of:

(a) imaging, as a first processed image, a part of said at least one pattern field;

(b) storing, as a reference image, at least one first video signal of images of said pattern elements within said first processed image and obtaining a position of said first video signal in said first processed image;

(c) imaging a part of said at least one pattern field including a pattern element different from said pattern elements in step (b) by moving said substrate by a distance corresponding to said predetermined interval and detecting a second video signal as a second processed image;

(d) detecting a video signal corresponding to said reference image from said second video signal and detecting a position of said corresponding video signal in said second processed image; and (e) detecting a position of said substrate based on a position of said first video signal and a position of said corresponding video signal.

2. A method according to claim 1, further comprising the step of detecting a position of a fiducial mark formed off of said at least one pattern field, prior to said storing of said at least one video signal, and wherein said plurality of pattern elements have a predetermined positional relationship with said fiducial mark.

* * * * *